United States Patent
Redman-White et al.

(10) Patent No.: US 6,542,103 B2
(45) Date of Patent: Apr. 1, 2003

(54) ERROR SIGNAL GENERATING ARRANGEMENT

(75) Inventors: William Redman-White, Los Catos, CA (US); Simon D. Bramwell, Romsey (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/920,037

(22) Filed: Aug. 1, 2001

(65) Prior Publication Data

US 2002/0021237 A1 Feb. 21, 2002

(30) Foreign Application Priority Data

Aug. 2, 2000 (GB) .............................. 0018841

(51) Int. Cl.[7] .................................. H03M 1/34
(52) U.S. Cl. ....................... 341/158; 714/795
(58) Field of Search ................. 341/158; 714/795; 371/43

(56) References Cited

U.S. PATENT DOCUMENTS 5,384,560 A  1/1995  Yamasaki .................. 340/146
5,448,583 A * 9/1995  Miyamoto et al. ............. 371/43
5,450,389 A  9/1995  Hayashi ........................ 369/59
5,661,709 A  8/1997  Takagi et al. .................. 369/59
5,661,713 A  8/1997  Honma ........................ 369/124
5,790,495 A  8/1998  Kimura et al. ................. 369/59
5,917,859 A  6/1999  Yamasaki et al. ........... 375/262
5,987,637 A * 11/1999  Thomas ....................... 714/795

FOREIGN PATENT DOCUMENTS

EP        0658896 A2    6/1995

* cited by examiner

Primary Examiner—Peguy JeanPierre
Assistant Examiner—Joseph J Lauture
(74) Attorney, Agent, or Firm—Steven R. Biren

(57) ABSTRACT

An arrangement for generating an error signal representing the differences between an input signal voltage level ($xp_k$, $xn_k$) and an estimated value (rp, rn) for the input signal voltage level comprises first (T1, T2) and second (T5, T6) transconductors and a differencing circuit (T3, T4, T7, T8) which forms the modulus of the difference between the outputs of the transconductors. The error signal is converted into a probability signal by subtracting the error signal from a constant signal (408) to produce a signal at the output (407) which is a maximum when the input voltage level and estimated voltage level are equal.

11 Claims, 10 Drawing Sheets

Figure 1:
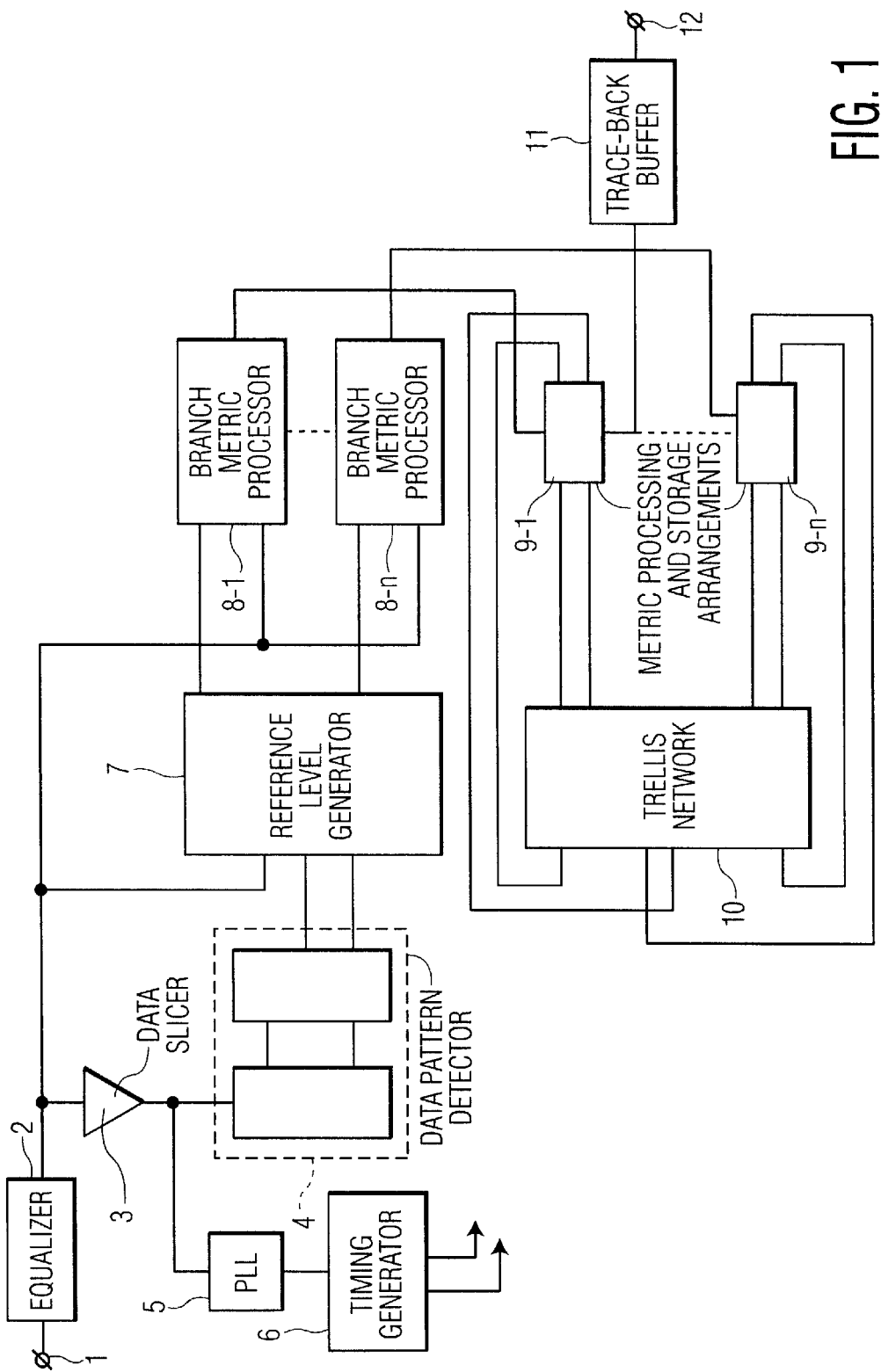

```
-1 -1 -1 -1 -1      1
-1 -1 -1 -1  1      2
-1 -1 -1  1  1      3
-1 -1  1  1  1      4
-1  1  1  1 -1      5
-1  1  1  1  1      6
 1 -1 -1 -1 -1      7
 1 -1 -1 -1  1      8
 1  1 -1 -1 -1      9
 1  1  1 -1 -1     10
 1  1  1  1 -1     11
 1  1  1  1  1     12
```

ERROR SIGNAL GENERATING ARRANGEMENT

The invention relates to an arrangement for generating an error signal, to an arrangement for generating a probability signal, and to a Viterbi decoder including such arrangements.

There is a continuing and increasing desire for larger data capacity on optical discs. Additionally, there is a desire for greater speed in reading the data from the disc. These two demands arise from the increasing use of optical storage media in video and high speed data applications and both these applications require performance far greater than that achieved in the original audio compact disc applications. As a result there is a demand for methodologies which allow for recovery of the data at rates which are at or near the limit achievable given the physics of the media, mechanics, optics, and electronics.

One of the consequences is an increasing level of inter-symbol interference in the data channel when reading data from the disc. The use of Viterbi decoders in reading data from optical discs has been disclosed in U.S. Pat. Nos. 5,661,709 and 5,450,389. These documents disclose arrangements in which the input signal is digitised in an A/D converter and all the manipulations are carried out in the digital domain. DVD systems currently being designed have the capability of decoding data at sixteen times nominal speed which represents a channel bit rate in excess of 400 Mb/s. As a result it requires very high speed digital signal processing leading to increased costs.

It is an object of the invention to enable the provision of a decoder, particularly, but not exclusively, for data read at high speed from an optical disc without requiring the use of high speed digital signal processors.

The invention provides an arrangement for generating an error signal representing the difference between an input signal voltage level at a sampling instant and an estimated value for the input signal voltage level, the arrangement comprising first and second transconductors, means for feeding the input signal to an input of the first transconductor, means for feeding the estimated value to an input of the second transconductor, and a differencing circuit for forming the modulus of the difference between the outputs of the first and second transconductors, the output of the differencing circuit providing the error signal.

A necessary part of a Viterbi decoder is a means for deriving the difference between an input signal and estimates of the valid values that the signal may have at the sampling instants. The arrangement described in the preceding paragraph enables an error signal to be determined which represents the modulus of the difference between these two values.

In an optical disc player and particularly in a DVD player, the physical aperture of the optical system is such that one bit period is much shorter than the total response of the photodiode system so inter-symbol interference occurs. In present laser optic recording there is a minimum number of consecutive "1s" or "0s" that are allowed in the data encoding (d-constraint). This number is currently three, that is in any data sequence must contain a minimum of three consecutive "1s" or three consecutive "0s". This leads to a signal waveform that appears to be band limited but whose peak and trough levels are functions of the number of bits of the same value. The peak achieved with only three successive "1s" will be lower than if there are many successive "1s" (up to seventeen are allowed in the DVD standard). The sequences where only three successive bits have the same value, that is 01110 and 10001, are known as I3 states. As a result there are a number (in this case twelve, or eight if a symmetrical channel characteristic is assumed) of valid levels that the input signal may have depending on the sequence of bits being received. The arrangement described enables the error between the input signal voltage and estimates of the valid values to be obtained and subsequently used to determine the most likely data sequences.

The arrangement may further comprise a current subtractor for forming a probability signal, the probability signal representing the probability that the input signal is a signal of the estimated value, a reference current source being coupled to a first input of the subtractor and the error signal being coupled to a second input of the subtractor, the output of the subtractor providing the probability signal.

In this case where the input signal is compared with a number of estimates or reference levels an output is produced which increases in magnitude the closer the input signal level is to the estimate.

The input signal and the estimated value may both be differential signals, the first and second transconductors both being of differential form.

The arrangement may be such that the positive input signal and positive estimated value are applied to first and second inputs of the first transconductor and the negative input signal and the negative estimated value are applied to first and second inputs of the second transconductor.

This arrangement reduces the need for the two transconductors to have good linearity across the whole of their ranges as it results in the maximum probability condition occurring when the transconductors have zero differential input. As a result only the offset is significant and the linearity is less important.

Each transconductor may comprise a first long tail pair formed by two field effect transistors each having a channel width W1 and whose tail current is equal to I1 and a second long tail pair formed by two further field effect transistors each having a channel width W2 and whose tail current is equal to I2, wherein the drain electrodes of the two long tail pairs are cross connected, I1>I2, and W2>W1.

This results in the transconductance being lower in the centre region of the characteristic and rising towards the extremes thus giving an approximation to a square law characteristic.

The invention further provides a Viterbi decoder including a plurality of such arrangements.

The Viterbi decoding algorithm requires the determination of the magnitude of the errors between the incoming signal levels and the expected valid levels and the tracing of the possible level transitions through the allowable sequence of states. This process requires several manipulations of signals for each sample of input data to obtain certain metric values. These metric values are combined with stored values derived in previous sample periods. The manipulations include modulus subtraction, determination of the maximum of multiple inputs, and multiplication by constants. Further multiple signal paths are required in parallel. This leads to significant bottlenecks in the data flow in digital implementations. The present invention allows the modulus subtraction to be performed in the analogue domain using comparatively simple circuitry that can be easily replicated to create parallel signal processing paths.

Figure 2:
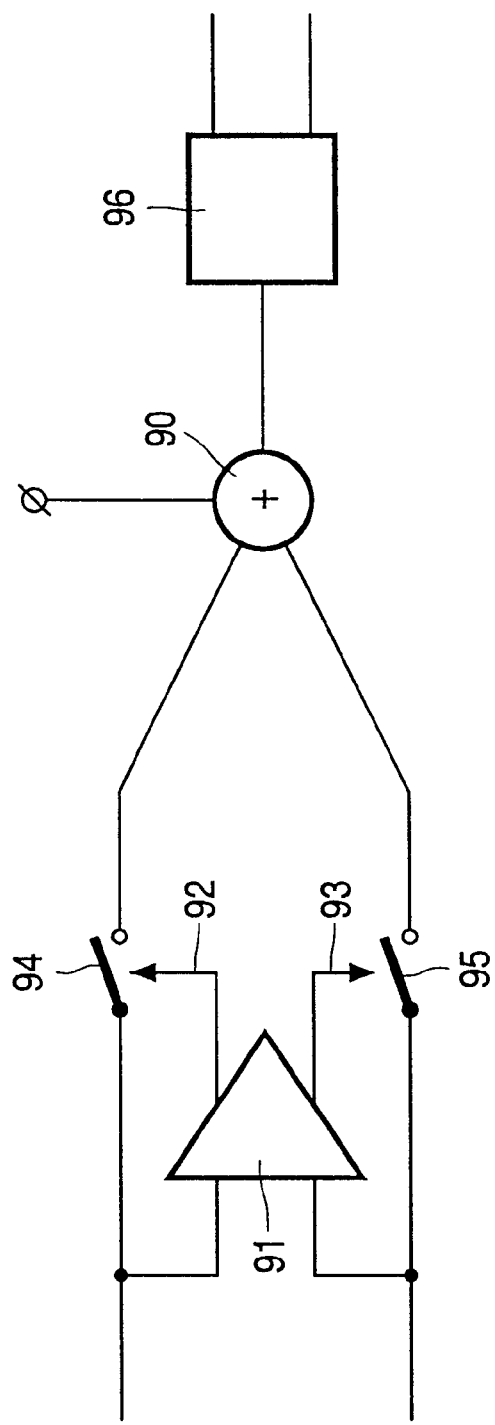
Figure 3:
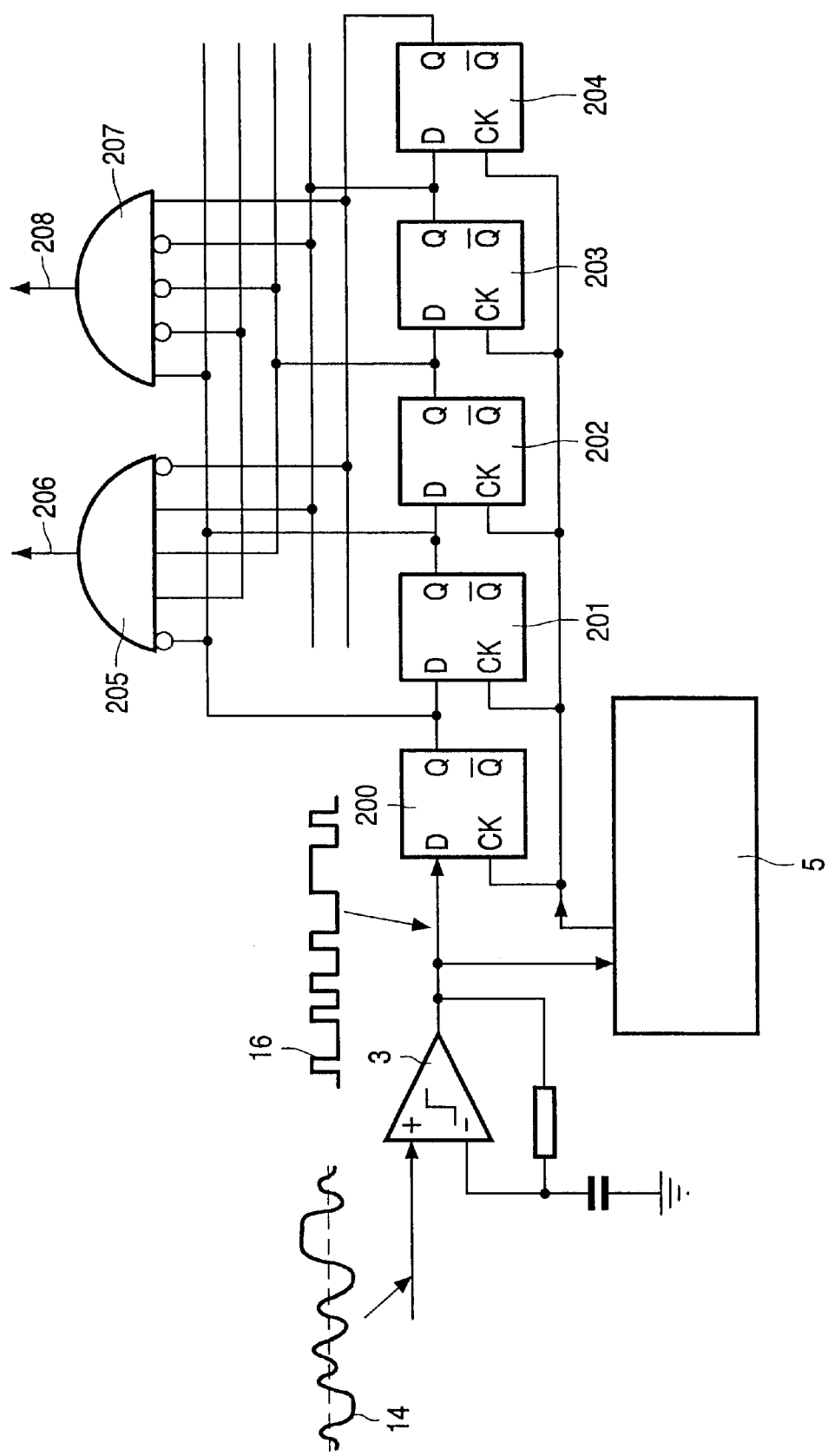
Figure 4:
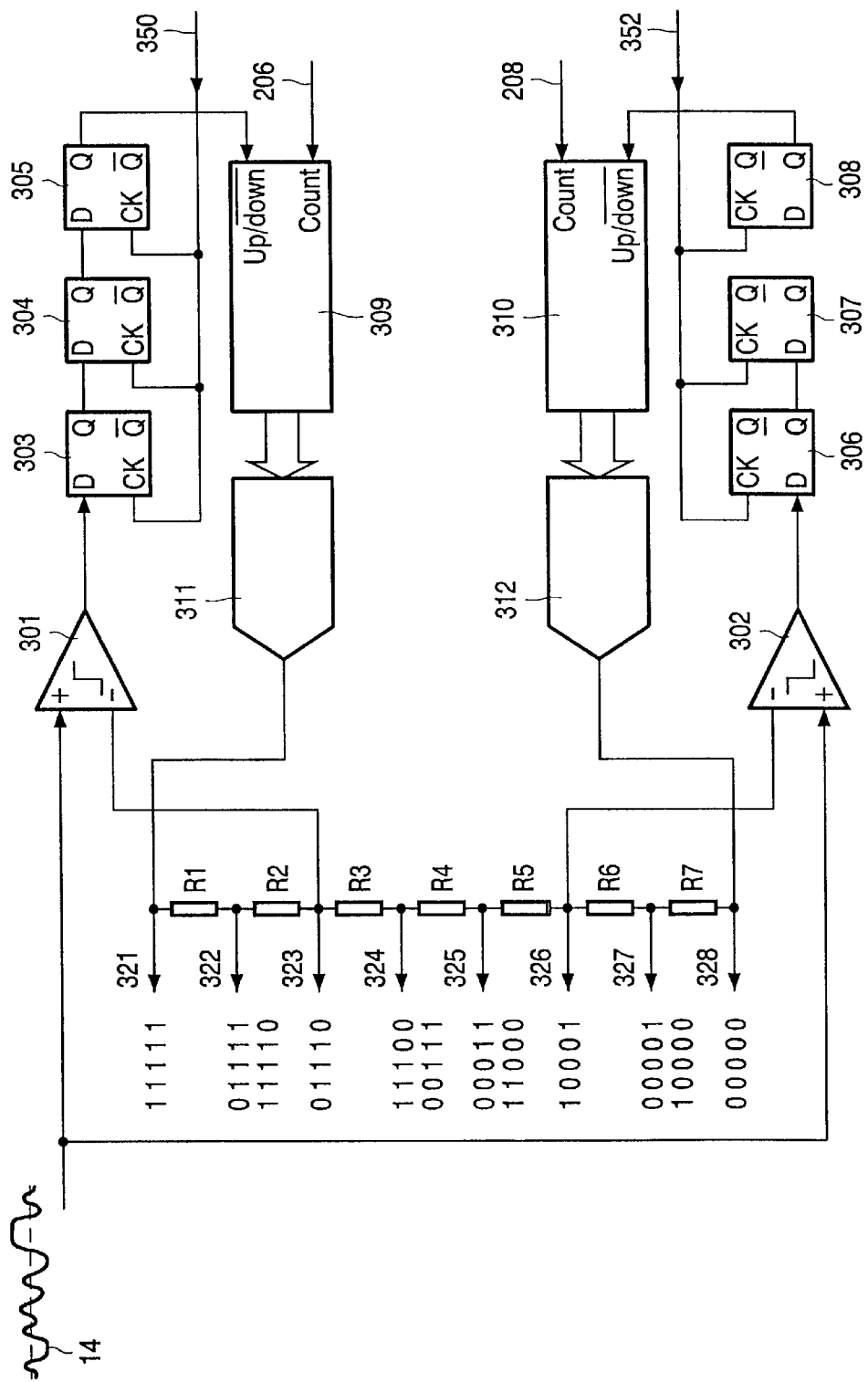
Figure 5:
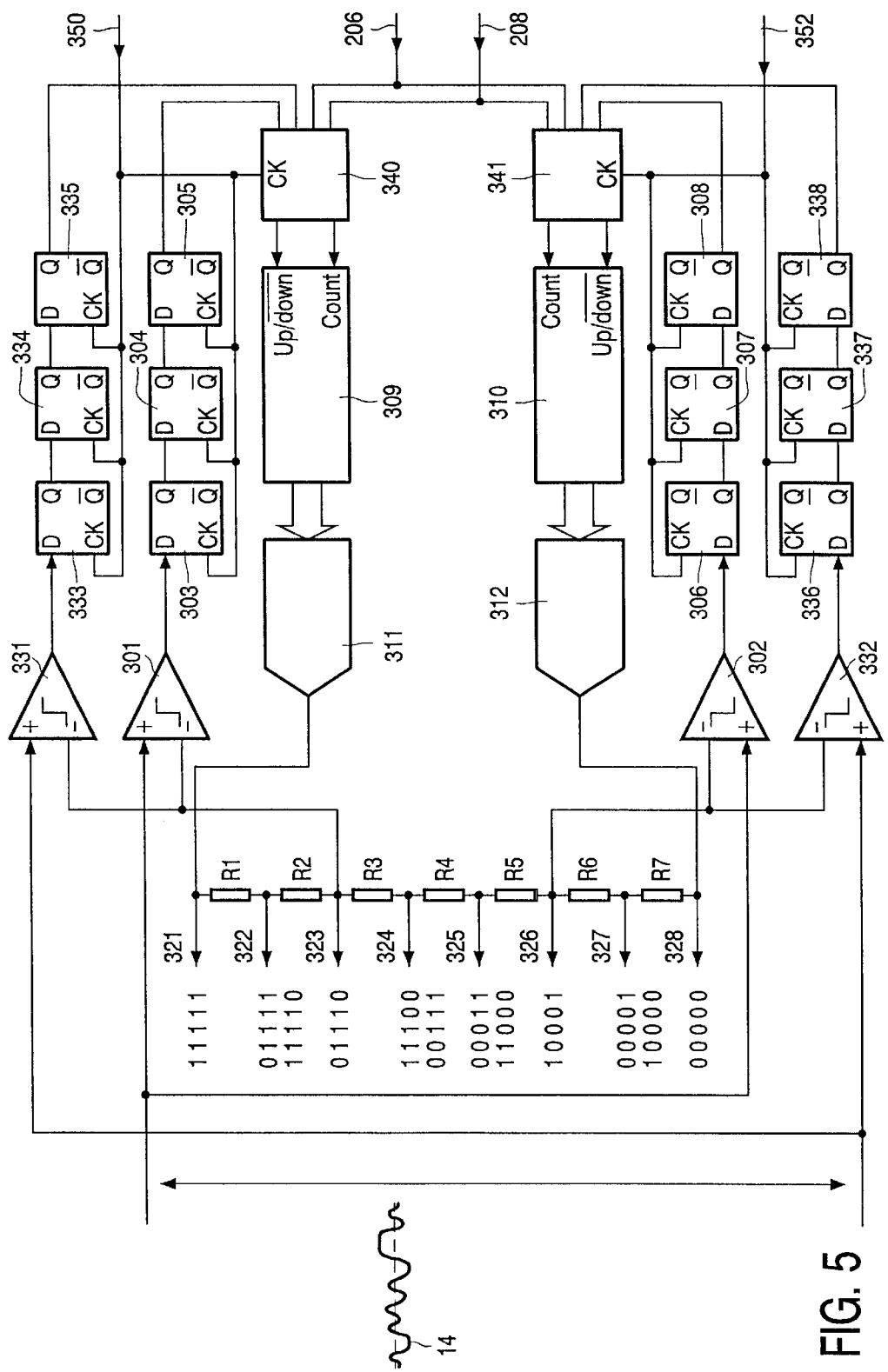
Figure 6:
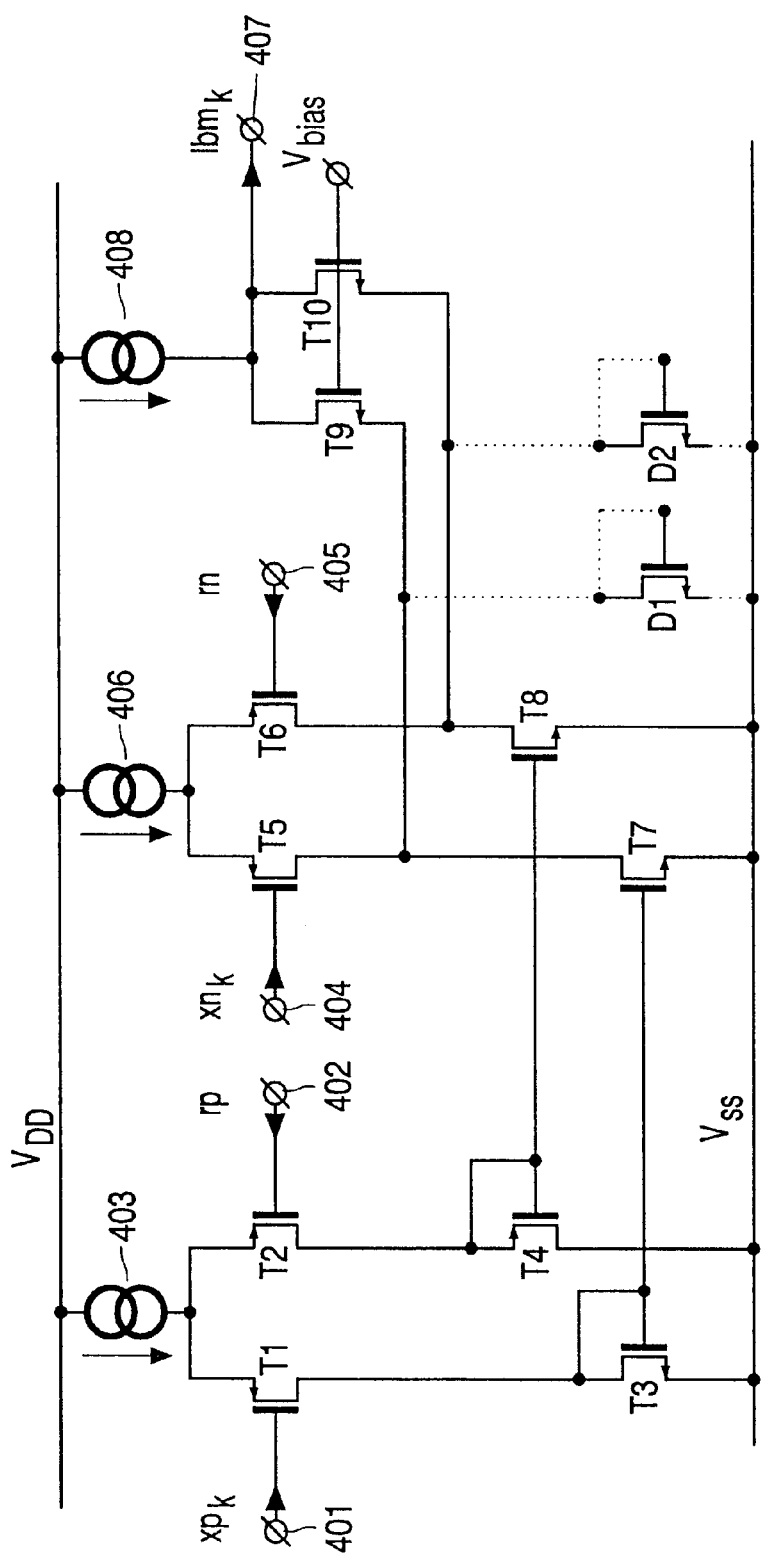
Figure 7:
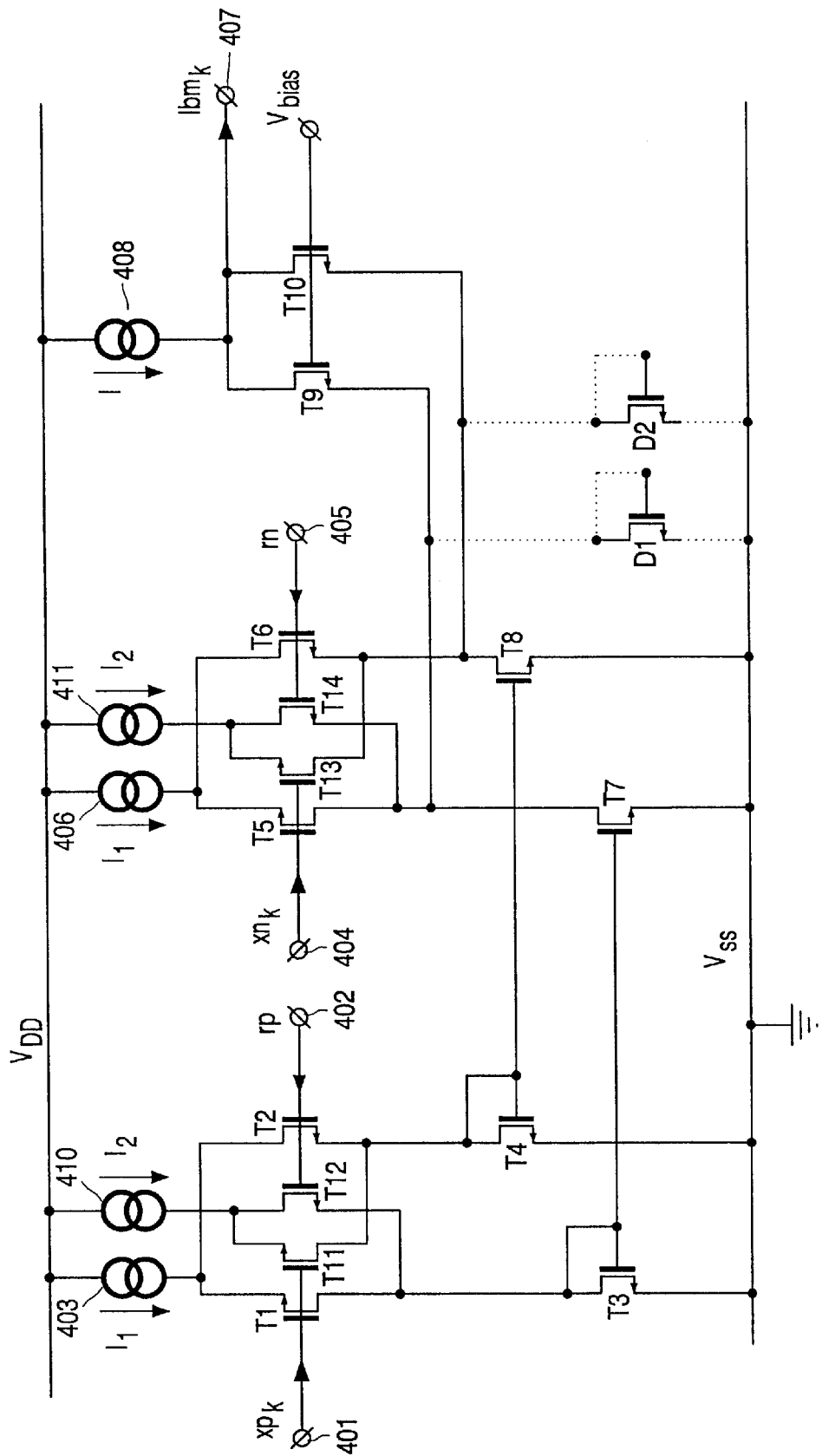
Figure 8:
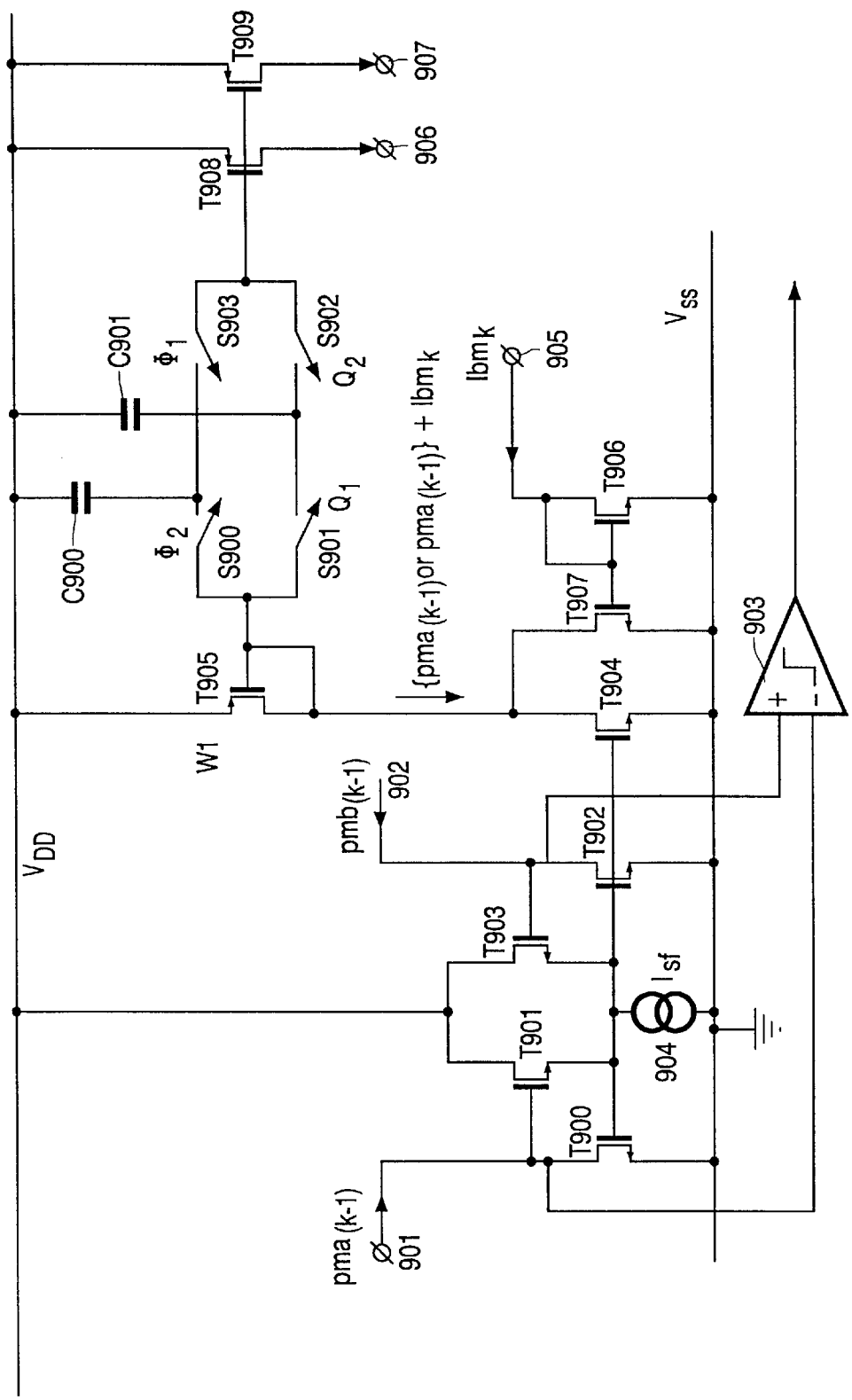
Figure 9:
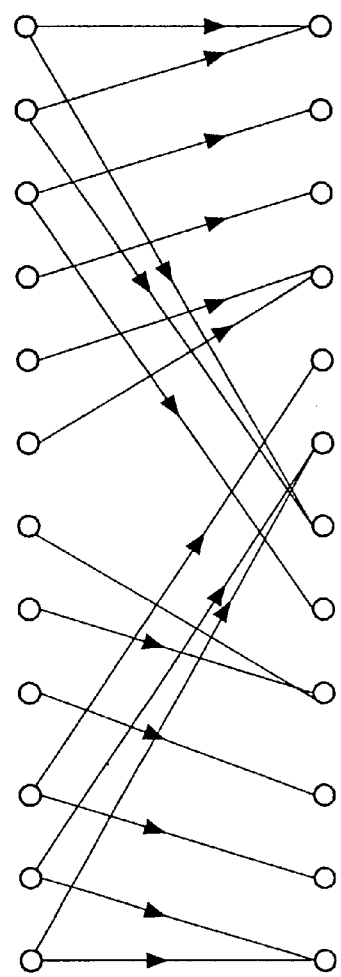
Figure 10:
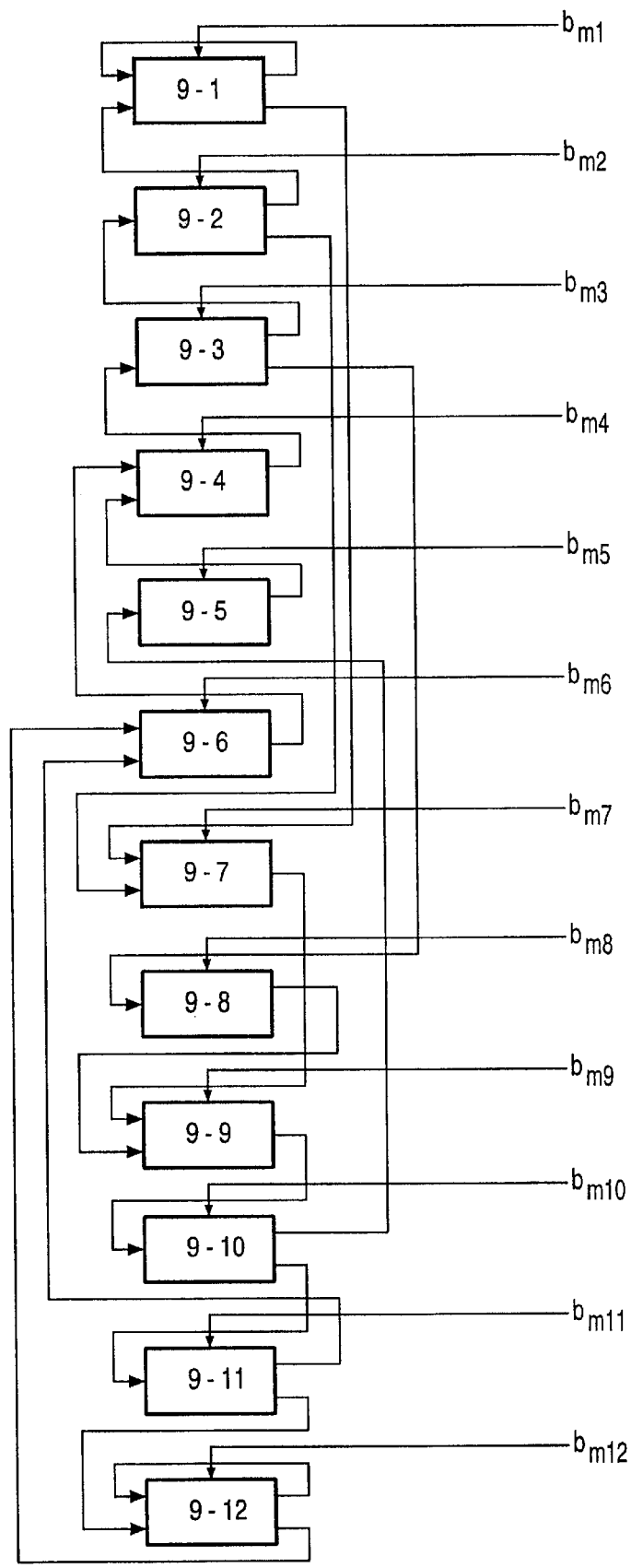

The above and other features and advantages of the invention will be apparent from and elucidated in the following description, by way of example, of embodiments of the invention with reference to the accompanying drawings, in which:

FIG. 1 shows in block schematic form a Viterbi decoder according to the invention, FIG. 2 shows in block schematic form a path metric processing and storage arrangement for use in the decoder of FIG. 1, FIG. 3 shows in block schematic form a circuit arrangement for detecting certain patterns in the input data, FIG. 4 shows in block schematic form a first embodiment of a circuit arrangement for producing estimated values of valid input signal values, FIG. 5 shows in block schematic form a second embodiment of a circuit arrangement for producing from differential input signals estimated values of valid input signal values, FIG. 6 is a circuit diagram of a first embodiment of a branch metric processor for producing a path probability signal, FIG. 7 is a circuit diagram of a second embodiment of a branch metric processor for producing a path probability signal, FIG. 8 is a circuit diagram of a path metric processing and storage arrangement, FIG. 9 is a trellis connection diagram showing the required connection for all legitimate data sequences, and FIG. 10 shows the corresponding interconnection of the path metric processing and storage arrangements for data having the constraints specified in the present embodiment.

The Viterbi decoder shown in FIG. 1 has in input 1 for receiving an input data signal to be decoded. In this particular example the input data is received from a read head of an optical disc player, for example a CD or DVD player. The input signal may then be passed through an equaliser 2, which may be adaptive. The optionally equalised signal is then sliced by a first data slicer 3 and the sliced signal is fed to a data pattern detector 4. A phase locked loop (PLL) 5 is also connected to the output of the data slicer 3 to derive a symbol rate clock from the received input signal. The output of the PLL 5 feeds a timing generator 6 for generating the clock signals required to synchronise the various elements of the decoder with the input signal. The output of the data pattern detector is fed to a reference level generator 7 which generates estimates of valid values for the input signal at sampling instants of the signal.

The input signal is also applied to a plurality of branch metric processors 8-1 to 8-n in which the input signal is compared with the estimated valid signal values and a probability function is derived to indicate the probability that the input signal corresponds with each of the estimated valid values. In the particular example being described there are twelve branch metric processors, that is n=12. This is because there are twelve possible signal sequences that are valid. There are, however only eight estimated values which are generated as it is assumed that the middle bit of a sequence such as 11110 will have the same analogue value as the middle bit of the sequence 01111. As a result the same estimated value is input to both branch metric processors which expect input signals of the same value. In other words this embodiment is based on the assumption that the channel response is symmetrical. It would be possible to produce separate estimate for rising and falling signals and thus produce twelve estimated values but this would require two resistor chains and four DACs.

The outputs of the branch metric processors 8-1 to 8-n are fed to respective path metric processing and storage arrangements 9-1 to 9-n. The arrangements 9-1 to 9-n are shown in block schematic form in FIG. 2 and comprise a summing circuit 90 to one input of which the output from the respective branch metric processor is connected. It also comprises a comparator 91 having first and second inputs connected to outputs of a trellis network 10 from which selected previous path metric values are connected. The comparator has two complementary outputs 92 and 93 that control two switches 94 and 95. The switches 94 and 95 connect the trellis network outputs to a second input of the summing circuit 90 in such a manner that the larger of the two previous path metric values is connected to the summing circuit 90. The output of the summing circuit 90 may be scaled by a factor K, where K<1. This provides the new path metric value and is stored in a store 96 and then applied to the appropriate input of the trellis 10 in the next symbol period to enable a new updated path metric value to be calculated. The output 94 of the comparator 91 is fed to the input of a Trace-Back Buffer 11 that is clocked at the symbol rate. The output of the Trace-Back Buffer is connected to the output 12 of the decoder and produces the decoded output.

The Trace-Back Buffer 11 stores a series of decisions, i.e. the outputs 94 of one of the comparators 91. Starting with either an arbitrary state, or with a state chosen as having the highest probability, The Trace-Back Buffer 11 traces the possible predecessors of that state by combining the state number at each instant (bit period) with the predecessor decisions stored for that instant so as to arrive at the most likely state at the previous instant (bit period). This is carried out successively for each bit period and results in the determination of a most likely state for an instant in the past. The length of time to the past instant being determined by the bit period and the length of the Trace-Back Buffer in number of stages. Provided that the Trace-Back Buffer has sufficient stages it is unimportant which comparator feeds its input since after a sufficient number of stages the output will be the same regardless of which comparator the output is taken from.

FIGS. 3 and 4 show in greater detail exemplary embodiments of the data pattern detector 4 and reference level generator 7. As shown in FIG. 3 the input signal 14 optionally after passing through an equaliser 2 is fed to a first input of the data slicer 3. The output signal 16 of the data slicer 3 is fed to the PLL 5 which produces a symbol rate clock that is applied to clock inputs of five D-type flip-flops 200 to 204. The flip-flops 200 to 204 are connected as a serial in parallel out shift register. The Q output of each of the flip-flops is connected to a respective input of AND gates 205 and 207. As shown selected ones of the inputs of the AND gates are negated so that AND gate 205 produces an output when the sequence 01110 occurs and the AND gate 207 produces an output when the sequence 10001 occurs. Thus the arrangement shown in FIG. 3 produces a logical signal at output 206 when the sequence 01110 occurs and at the output 208 when the sequence 10001 occurs. It would, of course, be possible to modify the arrangement in FIG. 3 and still perform the required function. For example, rather than negating selected inputs of the AND gates the $\overline{Q}$ output of the appropriate shift register stages may be connected to the AND gate input.

As shown in FIG. 4 the input signal is further applied to second and third data slicers 301 and 302. The second data slicer 301 slices the incoming signal at the estimated value for the middle bit of the sequence 01110. Similarly, the data slicer 302 slices the input signal at the estimated value for the middle bit of the sequence 10001. The output of the second data slicer 301 is fed to the serial input of a shift register formed by three D-type flip-flops 303 to 305 which are clocked by the symbol rate clock derived from the PLL 5 which is supplied on line 350. The output of the third data slicer 302 is fed to the serial input of a further shift register formed by three D-type flip-flops 306 to 308 which are also clocked by the symbol rate clock on line 352 derived from the PLL 5. The Q output of flip-flop 305 is fed to the up/down input of an up/down counter 309 while the output 206 of the data pattern detector is connected to the count input of the up/down counter 309. Similarly, the Q output of flip-flop 308 is fed to the up/down input of an up/down counter 310 while the output 208 of the data pattern detector is connected to the count input of the up/down counter 310. A parallel output of the up/down counter 309 is connected as the digital input to a first digital to analogue converter (DAC) 311, while a parallel output of the up/down counter 310 is connected as the digital input to a second digital to analogue converter (DAC) 312. The outputs of the DACs 311 and 312 are connected to opposite ends of a resistor chain formed by resistors R1 to R7. This gives eight estimates at tapping points 321 to 328 of valid input signal values for the possible sequences of five bits in the input signal. This particular implementation is intended for decoding data from DVD discs where coding restraint mean that the minimum number of successive "1s" in the signal is three and the minimum number of successive "0s" in the signal is also three. This taken together with the assumption that 00001 will produce the same input signal value as 10000 and likewise with other opposite sequences reduces the number of possible valid input signal values to eight.

In operation, the input signal is crudely sliced by the data slicer 3 to obtain an estimate of the data that may contain errors. The slicing level is set by a simple averaging operation based on the knowledge that the mean DC level of the data is zero. The sliced data is then passed to a shift register 200–204 by means of a symbol rate clock derived from the input data using the PLL 5. The five bits in the shift register are monitored by the AND gates 205 and 207 so that when the sequence 01110 or 10001 is present in the shift register the AND gate 205 or 207 gives an output to indicate that such a sequence has occurred. In order to keep an up to date estimate of the valid signal states, which will vary with input signal amplitudes, caused for example by finger marks on the disc, it is necessary to update the estimate using the signal value when the third bit of the five bit sequence arrived. Clearly it is not known until three symbol periods later that one of these sequences has arrived and it is necessary to be able to retrieve an indication of the signal value three symbol periods earlier. Clearly this could be achieved by providing an analogue signal memory into which a replica of the input signal is entered. This memory would need to be able to store at least three successive analogue samples so that the appropriate input value was available when required to update the estimated value.

An alternative approach used in this embodiment is to provide further data slicers 301 and 302 which slice the input signal at the estimated value for the middle bit of the sequences 01110 and 10001, hereinafter referred to as +ve I3 and −ve I3 data. The outputs of the data slicers 301 and 302 are fed to respective three stage shift registers so that at the output of each shift register a signal is produced to indicate whether the input signal was above or below the estimated value of the middle bit of the I3 data three symbol periods later. The outputs of the shift registers determine the count direction of the up/down counters 309 and 310 and counters 309 is accordingly incremented or decremented if +ve I3 data is detected, while counter 310 is incremented or decremented if −ve I3 data is detected. The count outputs of the counters 309 and 310 are fed to the respective DACs 311 and 312 where they are converted to an analogue voltage which is applied to opposite ends of the resistor chain. The estimated value for the +ve I3 data pattern is derived from the junction of resistors R2 and R3 and is used to define the slicing level of data slicer 301. Similarly, the estimated value for the −ve I3 data pattern is derived from the junction of resistors R5 and R6 and is used to define the slicing level for data slicer 302. These values are also used elsewhere in the decoder as will be apparent from the description with reference to FIGS. 4 to 6. Clearly the estimated values will increase or decrease by a small step each time an I3 data pattern is detected but they will remain close to the correct value, provided the counters and DACs have sufficient resolution, a constant input level causing the estimated value to oscillate about the correct value.

While FIGS. 3 and 4 have described an embodiment in which the given sequence is five bits long this procedure could be applied to data sequences of different length by changing the number of stages in the shift registers and number of inputs of the AND gates. Thus the arrangement shown in FIGS. 3 and 4 is an example of one embodiment of an arrangement for generating estimates of valid input signal values at sampling instants. It comprises an input 1 for receiving an input signal, a first data slicer 3 for slicing the input signal at a given slicing level, and a detector 205 for detecting a given data sequence in the sliced signal. A second data slicer 301 slices the input signal at a signal value estimated for a given data bit of the given data sequence, and a memory element 303 to 305 stores the output of the second data slicer when slicing the given data bit. Also provided is incrementing means 309. The incrementing means increases the estimated value when the stored output of the second data slicer indicates that the input signal value was above the estimated value when the given data bit was sliced and reduces the estimated value when the stored output of the second data slicer indicates that the input signal value was below the estimated value when the given data bit was sliced.

The arrangement shown in FIGS. 3 and 4 also comprises a second detector 207 for detecting the inverse of the given data sequence and a third data slicer 302 for slicing the input signal at a signal value estimated for a given data bit of the inverse of the given data sequence. A second memory element 306 to 308 stores the output of the third data slicer when slicing the given data bit of the inverse of the given data sequence. A second incrementing means 310 is also provided. The second incrementing means increases the estimated value when the stored output of the third data slicer indicates that the input signal value was above the estimated value when the given data bit of the inverse of the given data sequence was sliced and reduces the estimated value when the stored output of third data slicer indicates that the input signal value was below the estimated value when the given data bit of the inverse of the given data sequence was sliced.

In the embodiment shown in FIG. 3 the detector comprises a shift register 200 to 204 having a serial input to which the output of the first data slicer is connected and a logic decoder 204 having inputs connected to parallel outputs of the shift register, the logic decoder giving an output 206 indicating the presence of the given data sequence in the shift register.

In the embodiment shown in FIG. 4 the memory element comprises a further shift register 303–305 having a serial input to which the output of the second data slicer is connected and a serial output connected to the incrementing means, the incrementing means 309 being enabled by the output of the logic decoder 204.

As shown in FIG. 3 the first and second detectors comprise a common shift register 200–204 having a serial input to which the output of the first data slicer is connected and a logic decoder 205,207 having inputs connected to parallel outputs of the shift register, the logic decoders producing outputs 206,207 indicating the presence of the given or inverse data sequence in the shift register.

As shown in FIG. 4 the first 309 or each of first 309 and second 310 incrementing means comprises an up/down counter which is clocked by the output 206,208 of the respective detector 204,207 and whose count direction is determined by the state of the respective memory element 303–305,306–308 and a digital to analogue converter (DAC) 311,312 whose output determines the estimated signal value.

In the embodiment shown in FIG. 4 the estimated values are derived from tapping points 321–328 on a resistor chain R1-R7, the outputs of the DACs 311,312 being applied to opposite ends of the resistor chain.

As an alternative it would be possible to provide a logic decoder for all the permissible 5-bit codes that would increment a separate up/down counter for each of the permissible code sequences. Separate data slicers for slicing the input signal at the estimated values for each of the permissible code sequences and separate three stage shift registers would be provided. The output of each of the shift registers would control the count direction of the respective up/down counter, the respective logic decoder causing the relevant counter to count. A DAC would receive the counter output for each permissible code sequence, the outputs of the DACs providing directly the estimated values for each of the sequences. This would enable any asymmetry of the channel to be compensated but would require more complex circuitry.

FIG. 5 shows in block schematic form a modification of the embodiment shown in FIG. 3 that is adapted to process differential input signals. Those elements in FIG. 5 corresponding to elements in FIG. 3 have been given the same reference signs. As shown in FIG. 5 two further data slicers 331 and 332 are provided together with associated shift registers formed by D-type flip-flops 333, 334, and 335 and 336, 337, and 338, respectively. Two selection circuits 340 and 341 are provided which select the output of the appropriate shift register for application to the up/down input of the counters 309 and 310. The selection circuits also each receive the outputs 206 and 208 of the pattern detectors 205 and 207 and the symbol rate clock, 350 and 352. As will be seen from FIG. 5 the positive differential signal is applied to data slicers 301 and 302 while the negative differential signal is applied to the data slicers 331 and 332.

In operation, when a positive I3 data pattern is detected the selectors 340 and 341 receive a signal from the detector output 206 (FIG. 3). This causes the Q output of flip-flop 305 to be connected to the up/down input of the counter 309 and the Q output of flip-flop 308 to be connected to the up/down input of counter 310. At the same time the detector output also causes the counters 309 and 310 to increment by one count in the direction determined by respective Q output. A similar process takes place when a negative I3 pattern is detected when the selectors receive a signal from detector output 208 (FIG. 3), but in this case the Q output of flip-flop 335 is connected to the up/down input of counter 309 while the Q output of flip-flop 338 is connected to the up/down input of counter 310. It will be appreciated that the taps on the resistor chain have a symmetrical structure and hence a differential estimate can be derived for processing by the branch metric processors 8-1 to 8-n. An alternative approach is to provide two arrangements as shown in FIG. 4 and to derive the differential estimated values from the two resistor ladders. This would have some performance advantages where the transmission channel is asymmetric.

All the arrangements for generating estimates described using resistor ladders for interpolating intermediate values may be provided with a plurality of resistor ladders which may be designed to take into account the different disc characteristics, that is CD, DVD, CD recordable, etc. The particular resistor ladder to be used would be switched into circuit in response to the detection or selection of a particular type of disc to be read.

FIG. 6 shows a first embodiment of the branch metric processor 8. The first stage in the determination of branch metric values is to compare the incoming signal values with estimated values of the allowable signal. The estimated values may be obtained as described with reference to FIGS. 2 and 3. In classical definitions of the Viterbi algorithm the squared error between the signal and each reference value is computed. In most practical implementations, however, the squaring is replaced by a modulus subtraction operation with little impact on the overall algorithm. In this embodiment the modulus subtraction is applied but instead of computing an error term a signal related to the probability that the incoming signal should be interpreted as being at a certain valid state is generated. Therefore, if when the input signal is compared with one of the reference values it is at or very close to that value then the output will be a maximum while it will be low if the input signal differs significantly from that the reference value.

The embodiment shown performs this operation using differential input signals. It will be noted that the reference values have a symmetrical structure. A single ended arrangement could, however, be used.

As shown in FIG. 6 the branch metric processor comprises a first differential input 401 and 402 connected to the gate electrodes of two p-channel field effect transistors T1 and T2. The source electrodes of transistors T1 and T2 are connected via a current source 403 to a supply rail $V_{DD}$. The drain electrode of transistor T1 is connected via the drain-source path of an n-channel field effect transistor T3 to a supply rail $V_{SS}$ while the drain electrode of transistor T2 is connected via the drain-source path of an n-channel transistor T4 to the supply rail $V_{SS}$. The gate and source electrodes of transistor T3 are commoned, as are the gate and source electrodes of transistor T4. A second differential input 404 and 405 is connected to the gate electrodes of two further p-channel field effect transistors T5 and T6. The source electrodes of transistors T5 and T6 are connected via a current source 406 to the supply rail $V_{DD}$. The drain electrode of transistor T5 is connected via the source-drain path of an n-channel field effect transistor T7 to the supply rail $V_{SS}$, while the drain electrode of transistor T6 is connected via the drain-source path of an n-channel field effect transistor T8. The gate electrode of transistor T3 is connected to the gate electrode of transistor T7 while the gate electrode of transistor T4 is connected to the gate electrode of transistor T8.

The junction of transistors T5 and T7 is connected to the source electrode of an n-channel field effect transistor T9 while the junction of transistors T6 and T8 is connected to the source electrode of an n-channel field effect transistor T10. The drain electrodes of transistors T9 and T10 are connected to an output 407 and via a current source 408 to the supply rail $V_{DD}$. The gate electrodes of transistors T9 and T10 are connected to a bias potential $V_{bias}$. Respective clamp diodes D1 and D2 are connected between the source electrodes of transistors T9 and T10 and the supply rail $V_{SS}$. It will be appreciated that the arrangement shown in FIG. 6 comprises two transconductors whose outputs are subtracted to perform a modulus subtraction.

The result to be derived is $$BM_k=|(xp_k-xn_k)-(rp-rn)| \quad (1)$$

where $xp_k$ and $xn_k$ are the positive and negative input signal values at time instant k, and rp and rn are the symmetrical reference values.

If equation (1) is implemented directly then the two transconductors must have good linearity across the whole signal range. This is because if both the bracketed signals are large but of the same magnitude this represents the minimum error or maximum probability.

Equation (1) can, however be rearranged as follows;

$$BM_k=|(xp_k-rp)-(xn_k-rn)| \quad (2)$$

This makes the maximum probability condition occur at the points where the transconductors have zero (or minimum) differential input and consequently only the offset is significant and the linearity is less important.

At first sight, this rearrangement implies no common mode rejection for the differential inputs, as the differential signals are not applied to differential inputs of the transconductors. If the bandwidth and accuracy of the current subtraction are good, however, some common mode rejection will occur as a result of the subtraction.

It will be appreciated that the result of equations (1) and (2) is the error signal and this is what is produced at the drain electrodes of transistors T7 and T8. In order to obtain a signal related to the probability the error signal is subtracted from the current produced by the current source 408 to produce an output signal equal to (1−error signal).

A modification of the branch metric circuit shown in FIG. 6 (and also to that shown in FIG. 7) is required for the branch metric circuits used at each end of the amplitude range. That is because if noise spikes cause the input signal value to exceed the extreme estimated levels then no branch metric circuit will give a high probability for the input signal level. That is if the level for a long series of "1s" or "0s" is exceeded the branch metric circuits will not indicate the high probability that the input signal level represents one of that series of "1s" or "0s". In order to enable these bench metric circuits, i.e. circuits 8-1 and 8-n to indicate a high probability under these circumstances one of the transistors T9 or T10, depending on which end of the amplitude range it is processing, is connected directly to the supply rail $V_{DD}$ while the other is connected to the output 407 and current source 408.

With the circuit shown in FIG. 6 the result is, in essence, an error term that is linearly proportional to the true error, albeit modified by the transconductor linearity. The circuit uses simple differential pairs of low transconductance and consequently the sensitivity is at a maximum near to the minimum error condition. This is the reverse of the ideal situation. Some improvement can be obtained by modifying the transconductance characteristic to have a low value at the minimum error condition and FIG. 5 is a circuit diagram of an arrangement in which the transconductance characteristic has been modified in such a manner.

In FIG. 7 those elements corresponding to elements in FIG. 6 have been given the corresponding reference signs. The circuit shown in FIG. 7 includes two additional p-channel field effect transistors T11 and T12 whose source electrodes are connected to the supply rail $V_{DD}$ via a current source 410. The drain electrode of transistor T11 is connected to the drain electrode of transistor T2 while the drain electrode of transistor T12 is connected to the drain electrode of transistor T1. The gate electrode of transistor T11 is connected to input 401 while the gate electrode of transistor T12 is connected to input 402. In addition the circuit includes two more additional p-channel field effect transistors T13 and T14 whose source electrodes are connected to the supply rail $V_{DD}$ via a current source 411. The drain electrode of transistor T13 is connected to the drain electrode of transistor T6 while the drain electrode of transistor T14 is connected to the drain electrode of transistor T5. The gate electrode of transistor T14 is connected to input 405 while the gate electrode of transistor T13 is connected to input 404. The currents produced by the current sources 403 and 406 are equal to $I_1$ while those produced by current sources 410 and 411 are equal to $I_2$. The channel width of transistors T1, T2, T5, and T6 is equal to $W_1$ and the channel width of transistors T11, T12, T13, and T14 is equal to $W_2$. By making $I_1>I_2$ and $W_2>W_1$ the transconductance is made lower in the centre region of the characteristic and rises towards the edges. In this way an approximation to a squared error function can be obtained.

FIG. 8 is a circuit diagram of a path metric processing and storage circuit suitable for use in the decoder of FIG. 1 and that corresponds to the schematic diagram in FIG. 2. It has two inputs, 901 and 902, which are connected to appropriate outputs of the trellis network 10. The input 901 is connected to a first input of a comparator 903, to the drain electrode of an n-channel field effect transistor T900 and to the gate electrode of a further n-channel field effect transistor T901. The input 902 is connected to a second input of the comparator 903, to the drain electrode of an n-channel field effect transistor T902 and to the gate electrode of a further n-channel field effect transistor T903. The drain electrodes of transistors T901 and T903 are connected to a supply rail $V_{DD}$ while their source electrodes are connected via a current source 904 to a supply rail $V_{SS}$. The gate electrodes of transistors T900 and T902 are connected via the current source 904 to the supply rail $V_{SS}$ and to the gate electrode of a further n-channel field effect transistor T904. A p-channel field effect transistor T905 has its source connected to the supply rail $V_{SS}$ and its gate and drain electrodes connected to the drain electrode of transistor T904. A further input 905 is connected to the gate and drain electrodes of an n-channel field effect transistor T906 and to the gate electrode of an n-channel field effect transistor T907. The source electrodes of transistors T904, T906, and T907 are connected to the supply rail $V_{SS}$. The drain electrode of transistor T904 is connected to the drain electrode of transistor T907. The gate electrode of transistor T905 is connected via a first switch S900 to a first capacitor C900 and via a second switch S901 to a second capacitor C901. The other sides of the capacitors C900 and C901 are connected to the supply rail $V_{DD}$. The source electrodes of two p-channel field effect transistors T908 and T909 are connected to the supply rail $V_{DD}$. The gate electrodes of transistors T908 and T909 are connected to the first capacitor C900 via a switch S902 and to the second capacitor C901 via a switch S903. The drain electrode of transistor T908 is connected to an output 906 while the drain electrode of transistor T909 is connected to an output 907.

The path metric processing stage shown in FIG. 8 takes the branch metric $Ibm_k$, that is the output current produced at the output 407 of FIG. 6 or FIG. 5 and adds it to the largest of the path metrics pma(k−1) and pmb(k−1) stored from previous states and applied to inputs 901 and 902 via the trellis network 10. That is the circuit shown in FIG. 7 performs a compare and select function on the two previous state path metrics and then adds to the present branch metric to the selected previous state path metric to form an updated state path metric. The comparison and selection functions are performed by a simple four transistor source follower and mirror arrangement formed by transistors T900 to T903. As current is forced into inputs 901 and 902 the mirror drain voltages increase, that is the drain voltages of transistors T900 and T902, but the source followers, transistors T901 and T903, will pull the gates of transistors T900 and T902 to the value needed by the transistor passing the largest current. Hence the output transistor T904 will replicate the largest of the currents supplied, that is the one from the previous path having the highest probability. It should be noted that this circuit could be expanded to provide more than two inputs and will select the largest of those inputs.

The addition function is performed by adding the currents passed by transistors T904 and T907. As has previously been described transistor T904 replicates the larger of the two path metric currents produced in the previous sampling period while input 905 is fed with the branch metric current for the present sampling period. This current is replicated in transistor T907. The summed current is sensed by the diode connected transistor T905 and stored in a current memory whose output is available at outputs 906 and 907. Two phase sampling is used in the current memory to ensure that the previous state path metric is available for output to the connection trellis while the present state processing takes place. That is, when switches S901 and S903 are closed an output current determined by the charge on capacitor C900 will be available and the capacitor C901 will be charged to the gate potential of transistor T905 which will depend on the sum of the currents in transistors T904 and T907. At the end of the present sampling period switches S901 and S903 open while switches S900 and S902 close causing the current state path metric to be stored and fed to outputs 906 and 907 for connection to the connection trellis for processing in the next sample period. A simple width scaling may be applied to the output transistors T908 and T909 to ensure that the accumulated results have an inherent decay to prevent signal levels expanding out of range.

The drain voltages of transistors T900 and T902 are applied to inputs of a comparator 903 and the assumed bit values are derived from its output and as shown in FIG. 1 applied to the input of a Trace Back Buffer from whose output a serial data stream can be taken. If the length of the Trace Back Buffer is made sufficiently long it is immaterial which of the path metric processor outputs is applied to the register input.

The present embodiment has been designed to decode data receive from optical discs and in the case of DVD discs there are certain constraints on the form in which the data is encoded and stored on the disc. In particular it is defined that the minimum run length is three bits, that is the minimum number of successive "1s" is three and so is the minimum number of successive "0s or −1s". This reduces the number of different permitted sequences of five bits to twelve rather than thirty two. It will be clear to the skilled person that the number of sequences will be dependent on the coding conditions and that the present embodiment illustrates one particular condition and that appropriate modifications to the number of paths could be made to decode data using different coding conditions.

The trellis connection diagram shown in FIG. 9 illustrates the possible valid state transitions from sample to sample. In FIG. 9 the twelve permitted sequences are listed in the centre column and the corresponding five bit sequences shown in the left hand column. In this diagram, incoming bits are represented at the left of the state description. Time steps proceed from left to right and the vertical array of nodes represent the possible states at each sample (or bit) period. The permissible states are defined by the sequences of five consecutive bits as illustrated in the left hand column. It will be apparent that with some states it is possible to move to one of two different states in the next bit period while for other states it is possible only to move to one state. Similarly, some states can only follow one previous state while other states can be arrived at from one of two previous states.

FIG. 10 shows the interconnection of twelve path metric processing and storage arrangements to implement the connection trellis shown in FIG. 9. As will be seen from FIG. 10 each of the path metric processing and storage arrangements 9-1 to 9-12 receives an input signal $bm_1$ to $bm_{12}$ from the corresponding branch metric processor 8-1 to 8-12. The arrangement 9-1 receives a first path metric input from a first output of the arrangement 9-1 and a second path metric input from a first output of the arrangement 9-2. The path metric inputs are those processed and stored in the previous bit period and the branch metric value for the present bit period is added to the largest of the path metric signals and stored for use in the next bit period. As will be apparent from FIG. 10 some of the path metric processing and storage arrangements have only one input and/or one output connected. This arises when there is only one permissible predecessor and/or successor state. As will be apparent, in order to calculate the path metric for the current bit period it is necessary to add the appropriate branch metric for the current bit period to the largest of the path metrics in the previous bit period. Thus the calculated path metrics are stored in the arrangements 9-1 to 9-12 so that they are available at the outputs for application to the inputs of the arrangements 9-1 to 9-12 at the start of the next bit period.

Clearly if differently encoded data having different coding constraints and different sequence lengths affecting inter symbol interference are taken into account the number of trellis paths and path metric processors will be modified accordingly.

From reading the present disclosure, other modifications will be apparent to persons skilled in the art. Such modifications may involve other features which are already known in the design and use of arrangements for generating error signals and data decoders using such arrangements and parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. An arrangement for generating an error signal representing the difference between an input signal voltage level at a sampling instant and an estimated value for the input signal voltage level, the arrangement comprising first and second transconductors, means for feeding the input signal to an input of the first transconductor, means for feeding the estimated value to an input of the second transconductor, a differencing circuit for forming the modulus of the difference between the outputs of the first and second transconductors, the output of the differencing circuit providing the error signal, and a current subtractor for forming a probability signal, the probability signal representing the probability that the input signal is a signal of the estimated value, a reference current source being coupled to a first input of the subtractor and the error signal being coupled to a second input of the subtractor, the output of the subtractor providing the probability signal.

2. An arrangement as claimed in claim 1 in which the input signal and the estimated value are both differential signals and the first and second transconductors are both of differential form.

3. An arrangement as claimed in claim 2 in which the positive input signal and positive estimated value are applied to first and second inputs of the first transconductor and the negative input signal and the negative estimated value are applied to first and second inputs of the second transconductor.

4. An arrangement as claimed in claim 1 in which the transconductance of each of the transconductors is lower in the centre region of the characteristic and rises towards the extremes to produce an approximation to a square law characteristic.

5. An arrangement as claimed in claim 4 in which each transconductor comprises a frist long tail pair formed by two field effect transistors having a channel width W1 and whose tail current is equal to I1 and a second long tail pair formed by two further field effect transistors having a channel width W2 and whose tail current is equal to I2, wherein the drain electrodes of the two long tail pairs are cross connected I1>I2, and W2>W1.

6. A Viterbi decoder comprising:
a plurality of arrangements for generating an error signal representing the difference between an input signal voltage level at a sampling instant and an estimated value for the input signal voltage level, wherein each arrangement comprises:

first and second transconductors;
means for feeding the input signal to an input of the first transconductor;
means for feeding the estimated value to an input of the second transconductor; and
a differencing circuit for forming the modulus of the difference between the outputs of the first and second transconductors, the output of the differencing circuit providing the error signal.

7. The decoder of claim 6 further comprising a current subtractor for forming a probability signal, the probability signal representing the probability that the input signal is a signal of the estimated value, a reference current source being coupled to a first input of the subtractor and the error signal being coupled to a second input of the subtractor, the output of the subtractor providing the probability signal.

8. The decoder of claim 6, wherein the input signal and the estimated value are both differential signals and the first and second transconductors are both of differential form.

9. The decoder of claim 8, wherein the positive input signal and positive estimated value are applied to the first and second inputs of the first transconductor and the negative input signal and the negative estimated value are applied to first and second inputs of the second transconductor.

10. The decoder of claim 6, wherein the transconductance of each of the transconductors is lower in the centre region of the characteristic and rises towards the extremes to produce an approximation to a square law characteristic.

11. The decoder of claim 10, wherein each transconductor comprises a first long tail pair formed by two field effect transistors having a channel width W1 and whose tail current is equal to I1 and a second long tail pair formed by two further field effect transistors having a channel width W2 and whose tail current is equal to I2, wherein the drain electrodes of the two long tail pairs are cross connected, I1>I2, and W2>W1.

* * * * *